(12) United States Patent
Oak

(10) Patent No.: US 10,902,889 B2
(45) Date of Patent: Jan. 26, 2021

(54) MEMORY HAVING BIT LINE SENSE AMPLIFIER

(71) Applicant: SK hynix Inc., Gyeonggi-do (KR)

(72) Inventor: Seung-Han Oak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/597,317

(22) Filed: Oct. 9, 2019

(65) Prior Publication Data

US 2020/0312385 A1      Oct. 1, 2020

(30) Foreign Application Priority Data

Mar. 25, 2019   (KR) .......................... 10-2019-0033511

(51) Int. Cl.
   *G11C 7/08*   (2006.01)
   *G11C 5/14*   (2006.01)
   *G11C 7/12*   (2006.01)

(52) U.S. Cl.
   CPC ................ *G11C 7/08* (2013.01); *G11C 5/147* (2013.01); *G11C 7/12* (2013.01)

(58) Field of Classification Search
   CPC ........... G11C 7/08; G11C 7/12; G11C 7/1096; G11C 5/147
   See application file for complete search history.

(56) References Cited

U.S. PATENT DOCUMENTS

| 9,431,071 B2 * | 8/2016 | Moon ................. G11C 11/4091 |
| 2018/0182449 A1 | 6/2018 | Kim et al. |
| 2018/0233192 A1 | 8/2018 | Won et al. |

* cited by examiner

*Primary Examiner* — David Lam
(74) *Attorney, Agent, or Firm* — IP & T Group LLP

(57) ABSTRACT

A memory may include: a bit line sense amplifier circuit configured to operate based on voltages supplied to a pull-up voltage terminal and a pull-down voltage terminal, provide an offset between a first bit line and a second bit line during an offset canceling period, and amplify a voltage difference between the first bit line and the second bit line during an amplification period; a first down-converter configured to generate a second pull-up voltage by down-converting a first pull-up voltage and supply the generated second pull-up voltage to a first node; a capacitor electrically connected to the first node; a charging component configured to charge the capacitor with the first pull-up voltage before the offset canceling period; and a first pull-up supply configured to supply a voltage of the first node to the pull-up voltage terminal during the offset canceling period.

12 Claims, 6 Drawing Sheets

MEMORY HAVING BIT LINE SENSE AMPLIFIER

CROSS-REFERENCE TO RELATED APPLICATION

This application claims priority under 35 U.S.C. § 119 to Korean Patent Application No. 10-2019-0033511, filed on Mar. 25, 2019, which is incorporated herein by reference in its entirety.

BACKGROUND

1. Field

Various embodiments relate to a memory, and more particularly, to a bit line sense amplifier circuit.

2. Discussion of the Related Art

Generally, a memory performs an operation of writing data inputted from an external device and reading the stored (or written) data. A basic unit for storing data is referred to as a cell. In the memory, one capacitor stores one piece of data. In order to read data stored in the capacitor and accurately transfer the read data to an external device, it is necessary to accurately determine the polarity of the data stored in the cell. A memory device includes a bit line sense amplifier (BLSA) as an amplifier circuit that determines the polarity of data and amplifies the data.

FIG. 1 is a diagram illustrating a conventional bit line sense amplifier circuit 100.

Referring to FIG. 1, the bit line sense amplifier circuit 100 includes a first inverter 110 and a second inverter 120 electrically connected to each other in a cross-coupled manner between a first bit line BLT and a second bit line BLB. FIG. 1 illustrates a memory cell CELL11 on the first bit line BLT side and a memory cell CELL12 on the second bit line BLB side together with the bit line sense amplifier circuit 100. The memory cell CELL11 includes a capacitor C11 and a cell transistor T11. The memory cell CELL12 includes a capacitor C12 and a cell transistor T12.

Before an amplification operation is performed by the bit line sense amplifier circuit 100, the bit line pair BLT and BLB may be precharged to substantially the same voltage level. Then, when a $0^{th}$ word line WL0 is activated, a charge sharing operation may be performed to transfer data stored in the capacitor C11 to the first bit line BLT through a channel of the cell transistor T11 electrically connected to the $0^{th}$ word line WL0. By the charge sharing operation, a voltage level of the first bit line BLT may be slightly higher or slightly lower than a precharge voltage level according to a logic value of data. In such a case, the second bit line BLB may substantially maintain the precharge voltage level as is.

After the charge sharing operation, a pull-up voltage is supplied to a pull-up voltage terminal RTO of the bit line sense amplifier circuit 100 and a pull-down voltage is supplied to a pull-down voltage terminal SB thereof, so that the bit line sense amplifier circuit 100 may be activated. The bit line sense amplifier circuit 100 may sense a potential difference between the first bit line BLT and the second bit line BLB, and amplify a high potential difference to be higher while de-amplifying a low potential difference to be lower.

Ideally, when there is a slight potential difference dV across the bit line pair BLT and BLB, the bit line sense amplifier circuit 100 needs to accurately sense and amplify the potential difference. However, in reality, the bit line sense amplifier circuit 100 does not accurately sense and amplify the potential difference. A minimum value of the potential difference dV across the bit line pair BLT and BLB for a correction operation of the bit line sense amplifier circuit 100 is referred to as an offset voltage. When the potential difference dV across the bit line pair BLT and BLB is less than the offset voltage, the bit line sense amplifier circuit 100 may not perform an accurate amplification and sensing operation. A factor causing the offset voltage may include mismatch of the inverters 110 and 120 for sensing and amplification. The inverter 110 includes a PMOS transistor 111 and an NMOS transistor 112, and the inverter 120 includes a PMOS transistor 121 and an NMOS transistor 122. These transistors need to be the same, but in reality, mismatch may exist for various reasons, such as a layout is not accurately drawn symmetrically in terms of structure, patterns are not formed identically even though the layout is drawn symmetrically, and/or contacts are not defined identically.

SUMMARY

Various embodiments are directed to a bit line sense amplifier circuit with reduced offset.

In an embodiment, a memory may include: a bit line sense amplifier circuit configured to operate based on voltages supplied to a pull-up voltage terminal and a pull-down voltage terminal, provide an offset between a first bit line and a second bit line during an offset canceling period, and amplify a voltage difference between the first bit line and the second bit line during an amplification period; a first down-converter configured to generate a second pull-up voltage by down-converting a first pull-up voltage and supply the generated second pull-up voltage to a first node; a capacitor electrically connected to the first node; a charging component configured to charge the capacitor with the first pull-up voltage before the offset canceling period; and a first pull-up supply configured to supply a voltage of the first node to the pull-up voltage terminal during the offset canceling period.

In another embodiment, a memory may include: a bit line and a bit line bar pair; a pull-up voltage terminal and a pull-down voltage terminal; a bit line sense amplifier circuit coupled between the bit line and the bit line bar, suitable for sensing and amplifying data on the pair based on voltages applied to the pull-up voltage terminal and the pull-down voltage terminal; a voltage converter coupled between a power supply terminal and a node, suitable for converting a power supply voltage to a core voltage and outputting the core voltage to the node; a capacitor coupled between the node and a ground voltage terminal; a charging component coupled between the power supply terminal and the node, suitable for charging the capacitor using the power supply voltage; a pull-up supply coupled between the node and the pull-up voltage terminal, suitable for supplying a voltage on the node to the pull-up voltage terminal; and a pull-down supply coupled between the pull-down voltage terminal and a ground voltage terminal, suitable for supplying a ground voltage to the pull-down voltage terminal.

According to the embodiment, it is possible to reduce offset of a bit line sense amplifier circuit.

DETAILED DESCRIPTION

Figure 1:
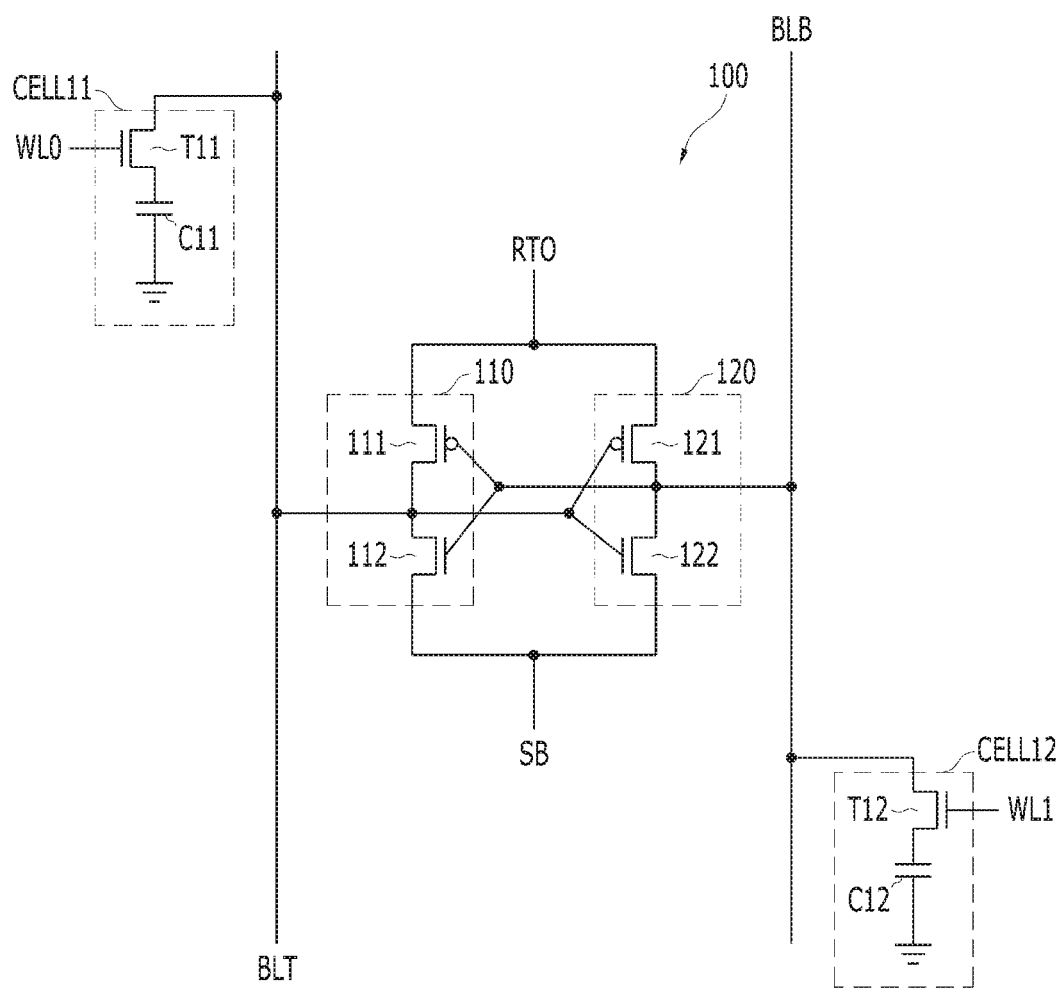
FIG. 1 is a diagram illustrating a conventional bit line sense amplifier circuit.

Various embodiments are described below in more detail with reference to the accompanying drawings. The present invention may, however, be embodied in different forms and thus is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Throughout the specification, reference to "an embodiment" or the like is not necessarily to only one embodiment, and different references to any such phrase are not necessarily to the same embodiment(s).

Throughout the specification, when one element is referred to as being 'connected to' or 'coupled to' another element, it may indicate that the former element is directly connected or coupled to the latter element or electrically connected or coupled to the latter element with one or more other elements interposed therebetween. Furthermore, when it is stated that an element "includes" or "comprises" a component, it means that the element may further include or comprise one or more other components, unless stated or the context indicates otherwise. Moreover, although a component is described in a singular form, that does not necessarily mean that there is only one such component. The articles 'a' and 'an' as used in this application and the appended claims should generally be construed to mean 'one or more' unless specified otherwise or clear from context to be directed to a singular form.

Figure 2:
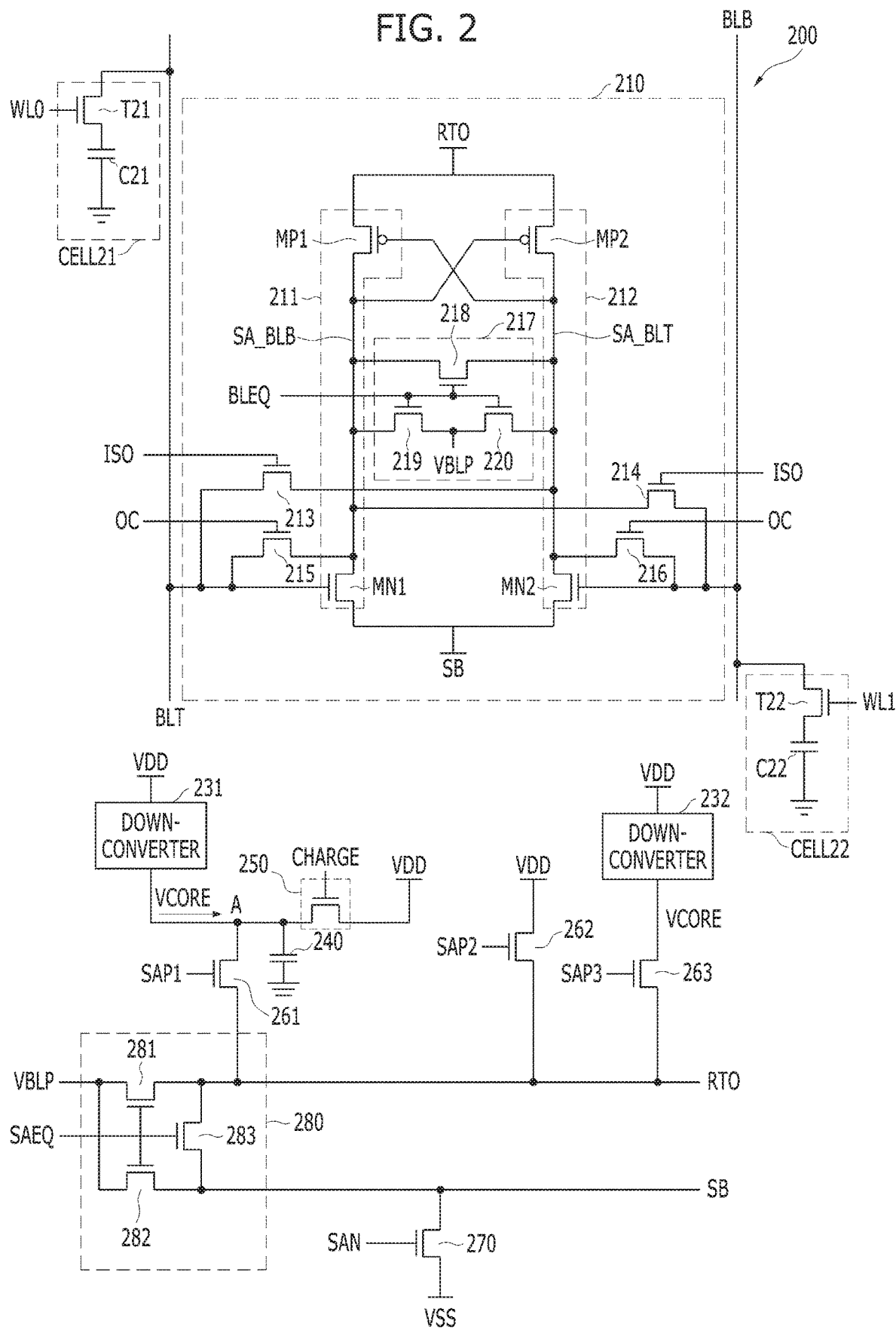
FIG. 2 is a diagram illustrating a configuration of a memory in accordance with an embodiment.

FIG. 2 is a diagram illustrating a configuration of a memory 200 in accordance with an embodiment.

Referring to FIG. 2, the memory 200 may include a bit line sense amplifier circuit 210, a first down-converter 231, a second down-converter 232, a capacitor 240, a charging component 250, a first pull-up supply 261, a second pull-up supply 262, a third pull-up supply 263, a pull-down supply 270, a power equalizer 280, and memory cells CELL21 and CELL22.

The bit line sense amplifier circuit 210 may operate based on a voltage supplied to a pull-up voltage terminal RTO and a pull-down voltage terminal SB. The bit line sense amplifier circuit 210 may reflect its own offset in a first bit line BLT and a second bit line BLB during an offset canceling period. The bit line sense amplifier circuit 210 may amplify a voltage difference between the first bit line BLT and the second bit line BLB during an amplification period. The bit line sense amplifier circuit 210 may include a first amplifier 211, a second amplifier 212, isolation switches 213 and 214, offset canceling switches 215 and 216, and an equalizer 217.

The first amplifier 211 may drive the second bit line BLB by inverting the voltage of the first bit line BLT at the time of activation of an amplification operation. The first amplifier 211 may operate based on the voltage of the pull-up voltage terminal RTO and the voltage of the pull-down voltage terminal SB. The amplification operation of the first amplifier 211 may be activated when voltages required for the operation are supplied to the pull-up voltage terminal RTO and the pull-down voltage terminal SB and the isolation switches 213 and 214 are turned on. The first amplifier 211 may include a first NMOS transistor MN1 and a first PMOS transistor MP1. The first NMOS transistor MN1 may drive a second inner node SA_BLB by using the voltage of the pull-down voltage terminal SB in response to the voltage of the first bit line BLT. The first PMOS transistor MP1 may drive the second inner node SA_BLB by using the voltage of the pull-up voltage terminal RTO in response to the voltage of a first inner node SA_BLT.

The second amplifier 212 may drive the first bit line BLT by inverting the voltage of the second bit line BLB at the time of the activation of the amplification operation. The second amplifier 212 may operate based on the voltage of the pull-up voltage terminal RTO and the voltage of the pull-down voltage terminal SB. The amplification operation of the second amplifier 212 may be activated when voltages required for the operation are supplied to the pull-up voltage terminal RTO and the pull-down voltage terminal SB and the isolation switches 213 and 214 are turned on. The second amplifier 212 may include a second NMOS transistor MN2 and a second PMOS transistor MP2. The second NMOS transistor MN2 may drive the first inner node SA_BLT by using the voltage of the pull-down voltage terminal SB in response to the voltage of the second bit line BLB. The second PMOS transistor MP2 may drive the first inner node SA_BLT by using the voltage of the pull-up voltage terminal RTO in response to the voltage of the second inner node SA_BLB.

The first isolation switch 213 may electrically connect the first bit line BLT and the first inner node SA_BLT to each other in response to an isolation signal ISO. The second isolation switch 214 may electrically connect the second bit line BLB and the second inner node SA_BLB to each other in response to the isolation signal ISO. The isolation switches 213 and 214 may be turned on when the isolation signal ISO is activated to a high level and turned off when the isolation signal ISO is deactivated to a low level.

The first offset canceling switch 215 may electrically connect the first bit line BLT and the second inner node SA_BLB to each other in response to an offset canceling signal OC. The second offset canceling switch 216 may electrically connect the second bit line BLB and the first inner node SA_BLT to each other in response to the offset canceling signal OC.

The equalizer 217 may supply a precharge voltage VBLP to the first inner node SA_BLT and the second inner node SA_BLB when an equalization signal BLEQ is activated to a high level. The precharge voltage VBLP may have a voltage level between a second pull-up voltage (or a core voltage) VCORE and a ground voltage VSS, and preferably, may have an intermediate level between the second pull-up voltage VCORE and the ground voltage VSS. The equalizer 217 may include three NMOS transistors 218 to 220.

The first down-converter 231 may generate the second pull-up voltage VCORE by down-converting a first pull-up voltage (or a power supply voltage) VDD and supply the generated second pull-up voltage VCORE to a first node A. The first down-converter 231 may operate in a manner that pull-up drives the first node A when a voltage level of the first node A is less than a target level of the second pull-up voltage VCORE. Since the second pull-up voltage VCORE is generated by down-converting the first pull-up voltage VDD, the level of the second pull-up voltage VCORE may be less than that of the first pull-up voltage VDD. The first pull-up voltage VDD may be a power supply voltage and the second pull-up voltage VCORE may be a core voltage.

The charging component 250 may charge the capacitor 240 electrically connected to the first node A by using the first pull-up voltage VDD in response to a charge signal CHARGE. The charging component 250 may electrically connect the capacitor 240 and the first pull-up voltage VDD to each other when the charge signal CHARGE is activated to a high level. The charging component 250 may electrically disconnect the capacitor 240 and the first pull-up voltage VDD from each other when the charge signal CHARGE is activated to a low level. The first pull-up supply 261 may supply the voltage of the first node A to the pull-up voltage terminal RTO in response to a first pull-up supply signal SAP1.

The second pull-up supply 262 may supply the first pull-up voltage VDD to the pull-up voltage terminal RTO in response to a second pull-up supply signal SAP2.

The second down-converter 232 may generate the second pull-up voltage VCORE by down-converting the first pull-up voltage VDD. The third pull-up supply 263 may supply the second pull-up voltage VCORE to the pull-up voltage terminal RTO in response to a third pull-up supply signal SAP3.

The pull-down supply 270 may apply the ground voltage VSS to the pull-down voltage terminal SB in response to a pull-down supply signal SAN.

The power equalizer 280 may supply the precharge voltage VBLP to the pull-up voltage terminal RTO and the pull-down voltage terminal SB in response to a power equalization signal SAEQ. The power equalizer 280 may include three NMOS transistors 281 to 283.

Figure 3:
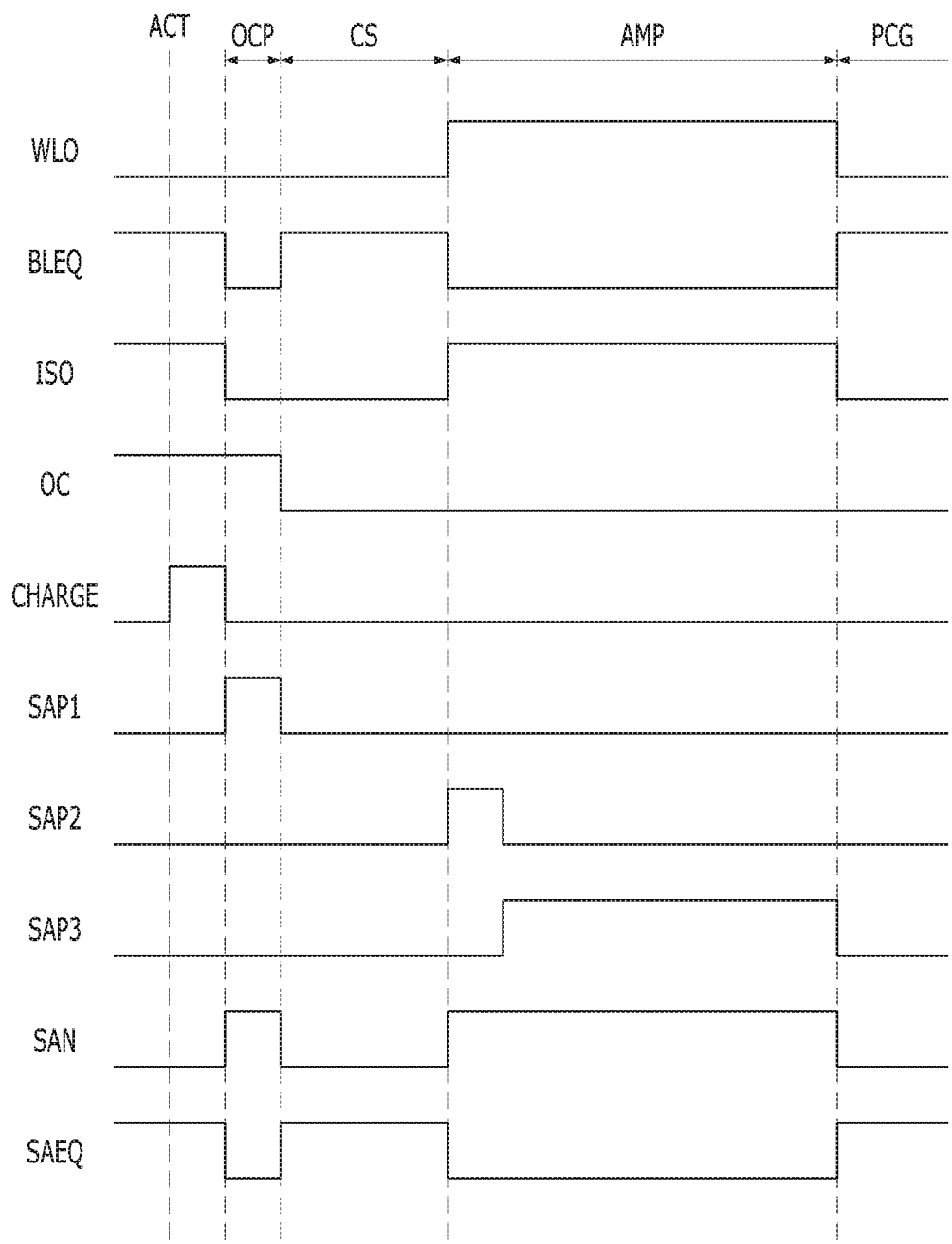
FIG. 3 is a timing diagram illustrating various signals for the memory of FIG. 2 according to operation periods.
Figure 4:
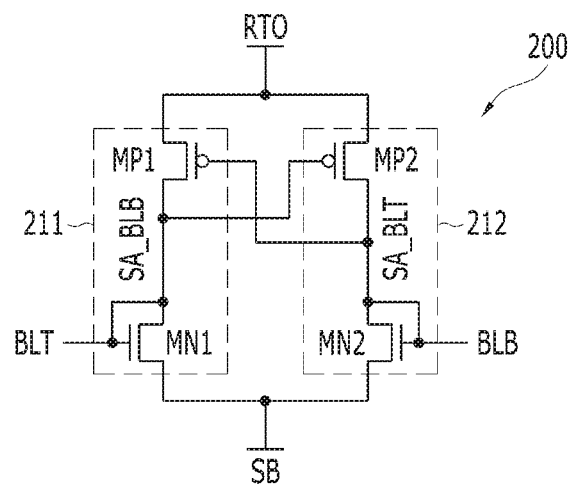
FIG. 4 is a diagram illustrating a connection state of a bit line sense amplifier circuit during an offset canceling period.
Figure 5:
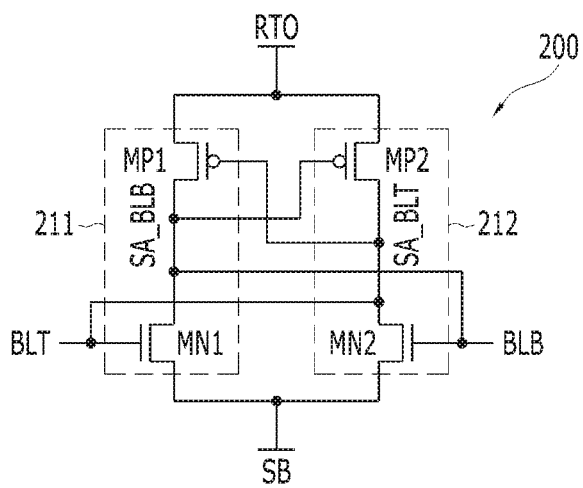
FIG. 5 is a diagram illustrating a connection state of a bit line sense amplifier circuit during an amplification period.
Figure 6:
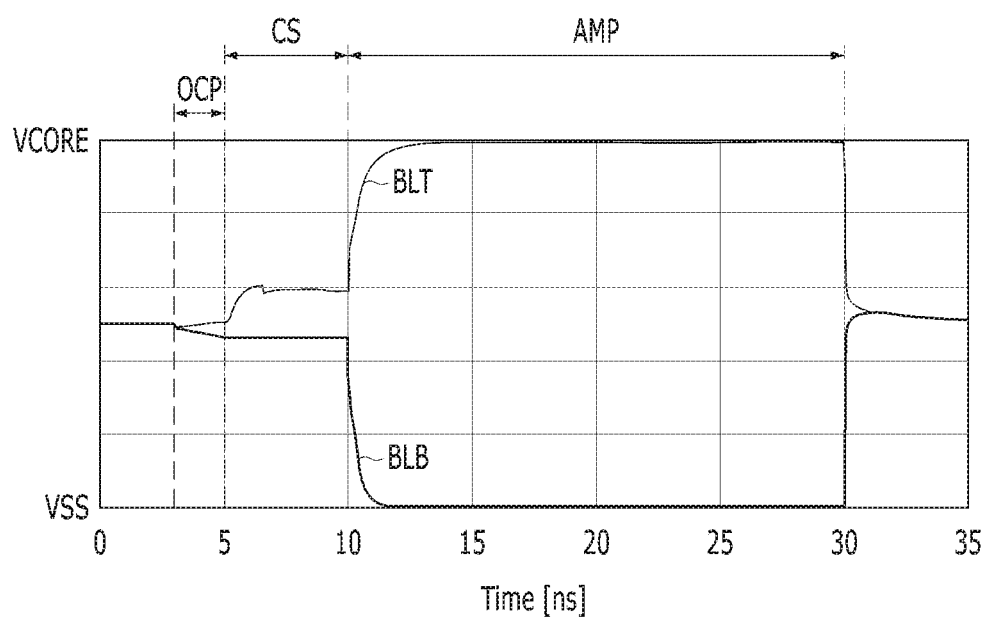
FIG. 6 is a diagram illustrating a change in voltages of a first bit line and a second bit line.
Figure 7:
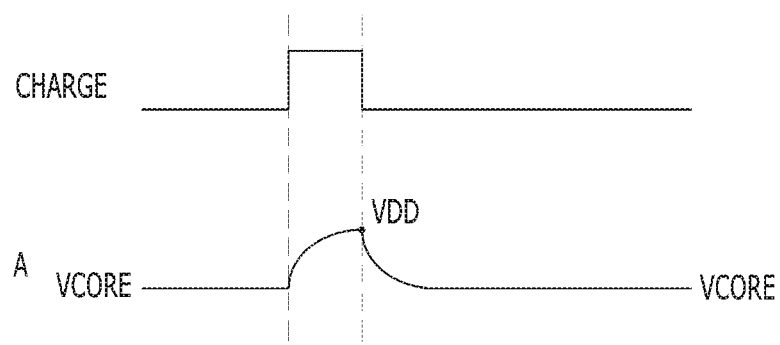
FIG. 7 is a diagram illustrating a change in a voltage of a first node.

FIG. 3 is a timing diagram illustrating various signals WL0, ISO, OC, BLEQ, CHARGE, SAP1, SAP2, SAPS, SAN, and SAEQ for the memory 200 of FIG. 2 according to operation periods. FIG. 4 is a diagram illustrating a connection state of the bit line sense amplifier circuit 210 during an offset canceling period OCP. FIG. 5 is a diagram illustrating a connection state of the bit line sense amplifier circuit 210 during an amplification period AMP. FIG. 6 is a diagram illustrating a change in the voltages of the first bit line BLT and the second bit line BLB. FIG. 7 is a diagram illustrating a change in the voltage of the first node A.

With reference to FIGS. 3 to 7, an operation of the memory of FIG. 2 is described. Such description is given in the context in which data of the memory cell CELL21 electrically connected to a word line WL0 is accessed.

Referring to FIG. 3, the charge signal CHARGE may be first activated in response to an active command ACT applied to the memory 200. As the charge signal CHARGE is activated, the capacitor 240 of the first node A may be charged to the level of the first pull-up voltage VDD. Then, the charge signal CHARGE may be deactivated and the offset canceling period OCP may be started. During the offset canceling period OCP, the equalization signal BLEQ, the power equalization signal SAEQ, the isolation signal ISO, the second pull-up supply signal SAP2, and the third pull-up supply signal SAP3 may be deactivated, and the offset canceling signal OC, the first pull-up supply signal SAP1, and the pull-down supply signal SAN may be activated. During the offset canceling period OCP, the bit line sense amplifier circuit 210 may enter a state as illustrated in FIG. 4. That is, the first NMOS transistor MN1 and the second NMOS transistor MN2 may become a diode-connected transistor, the voltage of the first node A may be supplied to the pull-up voltage terminal RTO, and the ground voltage VSS may be supplied to the pull-down voltage terminal SB. During the offset canceling period OCP, a threshold voltage of the first NMOS transistor MN1 may be reflected in the first bit line BLT and a threshold voltage of the second NMOS transistor MN2 may be reflected in the second bit line BLB. Referring to FIG. 7, it is possible to know a change in the voltage of the first node A during the activation of the charge signal CHARGE and the offset canceling period OCP. During the initial stage of the offset canceling period OCP, the first pull-up voltage VDD is supplied to the bit line sense amplifier circuit 210 and then the level of the first pull-up voltage VDD is gradually reduced, so that the second pull-up voltage VCORE may be supplied. Referring to the offset canceling period OCP of FIG. 6, it is possible to confirm that the voltage levels of the first bit line BLT and the second bit line BLB are slightly different from each other, and this difference between the voltage levels compensates for the offset of the bit line sense amplifier circuit 210.

After the offset canceling period OCP, a charge sharing period CS may be started. During the charge sharing period CS, the word line WL0 may be deactivated and data stored in the memory cell CELL21 may be transferred to the first bit line BLT. During the charge sharing period CS, the isolation signal ISO, the offset canceling signal OC, the charge signal CHARGE, the first pull-up supply signal SAP1, the second pull-up supply signal SAP2, the third pull-up supply signal SAPS, and the pull-down supply signal SAN may be deactivated and the equalization signal BLEQ and the power equalization signal SAEQ may be activated. That is, during the charge sharing period CS, the data stored in the memory cell CELL21 may be transferred to the first bit line BLT and the bit line sense amplifier circuit 210 may substantially maintain the deactivated state. Referring to FIG. 6, during the charge sharing period CS, as the data of the memory cell CELL21 is transferred to the first bit line BLT, it is possible to confirm that the voltage level of the first bit line BLT increases.

After the charge sharing period CS is ended, the amplification period AMP may be started. During the amplification period AMP, the voltage difference between the first bit line BLT and the second bit line BLB may be amplified. During the amplification period AMP, the offset canceling signal OC, the equalization signal BLEQ, and the power equalization signal SAEQ may be deactivated and the isolation signal ISO and the pull-down supply signal SAN may be activated. During the initial stage of the amplification period AMP, the second pull-up supply signal SAP2 may be activated and then the third pull-up supply signal SAPS may be activated. During the amplification period AMP, the bit line sense amplifier circuit 210 may enter a state as illustrated in FIG. 5. During the amplification period AMP, the first amplifier 211 may drive the second bit line BLB by inverting the voltage of the first bit line BLT and the second amplifier 212 may drive the first bit line BLT by inverting the voltage of the second bit line BLB. During the initial stage of the amplification period AMP, the first pull-up voltage VDD, which is a relatively high voltage, may be used in the amplification operation, and then the second pull-up voltage VCORE, which is a relatively low voltage, may be used in the amplification operation. Referring to FIG. 6, during the amplification period AMP, it is possible to confirm that the first bit line BLT is amplified to the level of the second pull-up voltage VCORE and the second bit line BLB is amplified to the level of the ground voltage VSS.

When a precharge command is applied to the memory 200, the amplification period AMP may be ended. In the drawings, PCG may indicate a precharge period after the amplification period AMP is ended by the precharge command.

The bit line sense amplifier circuit 210 reflects its own offset in the first bit line BLT and the second bit line BLB through the operation of the offset canceling period OC, so that it is possible to reduce the possibility of an erroneous operation due to the offset. Furthermore, the bit line sense amplifier circuit 210 operates based on the voltage stored in the capacitor 240 during the offset canceling period. The voltage stored in the capacitor 240 initially has the level of the first pull-up voltage VDD and then gradually decreases to the level of the second pull-up voltage VCORE. Accordingly, voltages similar to voltages used by the bit line sense amplifier circuit 210 are used during an actual amplification period, so that it is possible to reflect more accurate offset. Furthermore, it may be possible to adjust the intensity of offset compensation by simply adjusting a pulse width of the charge signal CHARGE.

Figure 8:
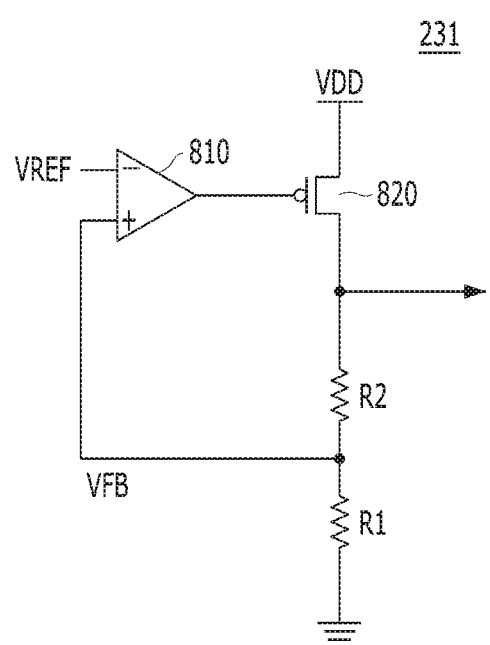
FIG. 8 is a diagram of illustrating a configuration of a first down-converter of FIG. 2.

FIG. 8 is a diagram illustrating a configuration of the first down-converter 231 of FIG. 2. The second down-converter 232 of FIG. 2 may also be designed in substantially the same manner as that of FIG. 8.

Referring to FIG. 8, the first down-converter 231 may include an operational amplifier 810, a PMOS transistor 820, and resistors R1 and R2.

The resistors R1 and R2 may generate a feedback voltage VFB by dividing the second pull-up voltage VCORE. A level of the feedback voltage VFB may be (VCORE*R1)/(R1+R2).

The operational amplifier 810 may receive a reference voltage VREF through a negative (−) terminal thereof and the feedback voltage VFB through a positive (+) terminal thereof. When the feedback voltage VFB has a level greater than that of the reference voltage VREF, an output signal of the operational amplifier 810 may have a high level. When the feedback voltage VFB has a level less than that of the reference voltage VREF, the output signal of the operational amplifier 810 may have a low level. The PMOS transistor 820 may be turned on to pull-up drive the second pull-up voltage VCORE when the output signal of the operational amplifier 810 has a low level. The PMOS transistor 820 may be turned off when the output signal of the operational amplifier 810 has a high level.

The operations of the operational amplifier 810 and the PMOS transistor 820 are repeated until the reference voltage VREF is the same as the feedback voltage VFB, i.e., the reference voltage VREF=the feedback voltage VFB. Accordingly, VREF=VFB=(VCORE*R1)/(R1+R2). As for VCORE, the level of the second pull-up voltage VCORE may be [VREF*(R1+R2)]/R1. [VREF*(R1+R2)]/R1 may directly become the target level of the second pull-up voltage VCORE, and the first down-converter 231 may pull-up drive an output terminal at which the second pull-up voltage VCORE is generated when the current level of the output terminal is less than the target level.

Although various embodiments have been illustrated and described, it will be apparent to those skilled in the art in light of the present disclosure that various changes and modifications may be made without departing from the spirit and scope of the invention as defined in the following claims.

What is claimed is:

1. A memory comprising:
   a bit line sense amplifier circuit configured to operate based on voltages supplied to a pull-up voltage terminal and a pull-down voltage terminal, provide an offset between a first bit line and a second bit line during an offset canceling period, and amplify a voltage difference between the first bit line and the second bit line during an amplification period;
   a first down-converter configured to generate a second pull-up voltage by down-converting a first pull-up voltage and supply the generated second pull-up voltage to a first node;
   a capacitor electrically connected to the first node;
   a charging component configured to charge the capacitor with the first pull-up voltage before the offset canceling period; and
   a first pull-up supply configured to supply a voltage of the first node to the pull-up voltage terminal during the offset canceling period.

2. The memory of claim 1, further comprising:
   a second pull-up supply configured to supply the first pull-up voltage to the pull-up voltage terminal during an initial period of the amplification period;
   a third pull-up supply configured to supply the second pull-up voltage to the pull-up voltage terminal after the initial period of the amplification period; and
   a pull-down supply configured to supply a ground voltage to the pull-down voltage terminal during the offset canceling period and the amplification period.

3. The memory of claim 2, further comprising:
   a second down-converter configured to generate the second pull-up voltage by down-converting the first pull-up voltage and supply the generated second pull-up voltage to the third pull-up supply.

4. The memory of claim 2, further comprising:
   a power equalizer configured to supply a precharge voltage to the pull-up voltage terminal and the pull-down voltage terminal in response to a power equalization signal.

5. The memory of claim 4, wherein, after the offset canceling period, during a charge sharing period before the amplification period, the power equalization signal is activated and data of a memory cell is charged by one of the first bit line and the second bit line.

6. The memory of claim 1, wherein the bit line sense amplifier circuit comprises:
   a first NMOS transistor configured to drive a second inner node using a voltage of the pull-down voltage terminal in response to a voltage of the first bit line;
   a second NMOS transistor configured to drive a first inner node using the voltage of the pull-down voltage terminal in response to a voltage of the second bit line;
   a first PMOS transistor configured to drive the second inner node using a voltage of the pull-up voltage terminal in response to a voltage of the first inner node;
   a second PMOS transistor configured to drive the first inner node using the voltage of the pull-up voltage terminal in response to a voltage of the second inner node;
   a first isolation switch configured to electrically connect the first bit line and the first inner node to each other;
   a second isolation switch configured to electrically connect the second bit line and the second inner node to each other;

a first offset canceling switch configured to electrically connect the first bit line and the second inner node to each other; and a second offset canceling switch configured to electrically connect the second bit line and the first inner node to each other.

7. The memory of claim 6, wherein the bit line sense amplifier circuit further comprises:

an equalizer configured to apply a precharge voltage to the first inner node and the second inner node in response to an equalization signal.

8. The memory of claim 6, wherein, during the offset canceling period, the first offset canceling switch and the second offset canceling switch are turned on and the first isolation switch and the second isolation switch are turned off.

9. The memory of claim 6, wherein, during the amplification period, the first isolation switch and the second isolation switch are turned on and the first offset canceling switch and the second offset canceling switch are turned off.

10. The memory of claim 1, wherein the first down-converter pull-up drives the first node when a voltage level of the first node is less than a target level of the second pull-up voltage.

11. A memory comprising:

a bit line and a bit line bar pair;

a pull-up voltage terminal and a pull-down voltage terminal;

a bit line sense amplifier circuit coupled between the bit line and the bit line bar, suitable for sensing and amplifying data on the pair based on voltages applied to the pull-up voltage terminal and the pull-down voltage terminal;

a voltage converter coupled between a power supply terminal and a node, suitable for converting a power supply voltage to a core voltage and outputting the core voltage to the node;

a capacitor coupled between the node and a ground voltage terminal;

a charging component coupled between the power supply terminal and the node, suitable for charging the capacitor using the power supply voltage;

a pull-up supply coupled between the node and the pull-up voltage terminal, suitable for supplying a voltage on the node to the pull-up voltage terminal; and a pull-down supply coupled between the pull-down voltage terminal and a ground voltage terminal, suitable for supplying a ground voltage to the pull-down voltage terminal.

12. The memory of claim 11, wherein the charging component includes a transistor, which is turned on to charge the capacitor using the power supply voltage, prior to an offset canceling period.

* * * * *